United States Patent
Namatame et al.

(10) Patent No.: US 6,580,088 B2
(45) Date of Patent: Jun. 17, 2003

(54) SEMICONDUCTOR DEVICES AND METHODS FOR MANUFACTURING THE SAME

(75) Inventors: Tatsuru Namatame, Sakata (JP); Kenji Yokoyama, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/847,071

(22) Filed: May 1, 2001

(65) Prior Publication Data

US 2002/0003289 A1 Jan. 10, 2002

(30) Foreign Application Priority Data

May 1, 2000 (JP) .......................................... 2000-132338

(51) Int. Cl.⁷ .............................................. H01L 29/12
(52) U.S. Cl. ........................... 257/10; 127/10; 127/344; 127/399
(58) Field of Search .......................... 257/10, 344, 399, 257/369, 374; 437/24; 438/280

(56) References Cited

U.S. PATENT DOCUMENTS

| | | | | |
|---|---|---|---|---|
| 5,181,090 A | * | 1/1993 | Maruo | 257/344 |
| 5,712,173 A | * | 1/1998 | Lu et azl. | 437/24 |
| 5,945,715 A | * | 8/1999 | Kuriyama et al. | 257/369 |
| 5,946,577 A | | 8/1999 | Tanaka | 438/297 |
| 5,960,291 A | * | 9/1999 | Krivokaptic | 438/286 |
| 5,989,963 A | | 11/1999 | Luning et al. | 438/289 |
| 6,018,185 A | * | 1/2000 | Mitani et al. | 257/374 |
| 6,127,708 A | * | 3/2000 | Okubo | 257/399 |
| 6,265,283 B1 | | 7/2001 | Nariman et al. | 438/424 |

FOREIGN PATENT DOCUMENTS

| | | | | |
|---|---|---|---|---|
| JP | 2534508 | 2/1989 | ........... | H01L/29/78 |
| JP | 2705106 | 11/1989 | ........... | H01L/27/10 |

* cited by examiner

*Primary Examiner*—David Nelms
*Assistant Examiner*—Thinh T. Nguyen
(74) *Attorney, Agent, or Firm*—Konrad Raynes Victor & Mann, LLP; Alan S. Raynes

(57) ABSTRACT

Certain embodiments relate to semiconductor devices having an improved dielectric strength and methods for manufacturing the same. A semiconductor device 1000 may have a field effect transistor 100. The field effect transistor 100 includes a gate dielectric layer 30, a source region 32 and a drain region 34. A semi-recessed LOCOS layer 40 may be provided between the gate dielectric layer 30 and the drain region 34. An offset impurity layer 42 may be provided below the semi-recessed LOCOS layer 40.

21 Claims, 9 Drawing Sheets

SEMICONDUCTOR DEVICES AND METHODS FOR MANUFACTURING THE SAME

Applicants hereby incorporate by reference Japanese Application No. 2000–132338, filed May 1, 2000 in its entirety. Applicants hereby incorporate by reference U.S. application Ser. No. 09/847,163 in its entirety.

TECHNICAL FIELD

The present invention relates to semiconductor devices and methods for manufacturing the same, including semiconductor devices having an improved dielectric strength and methods for manufacturing the same.

RELATED ART

Presently, there is known a field effect transistor having a LOCOS (Local Oxidation Of Silicon) offset structure, which is a field effect transistor having an improved dielectric strength. A field effect transistor having a LOCOS offset structure is a transistor in which a LOCOS layer is provided between a gate dielectric layer and a drain region, wherein an offset impurity layer is formed below the LOCOS layer. For example, Japanese patent No. 2705106 and Japanese patent No. 2534508 describe field effect transistors having a LOCOS offset structure.

It is noted that a field effect transistor having a LOCOS offset structure has a problem in which a bird's beak is formed at an end of the LOCOS such that the active region is narrowed.

SUMMARY

One embodiment relates to a semiconductor device including a field effect transistor, the field effect transistor including a gate dielectric layer, a source region and a drain region, wherein a semi-recessed LOCOS layer is provided between the gate dielectric layer and the drain region. In addition, an offset impurity layer is provided below the semi-recessed LOCOS layer.

Another embodiment relates to a method for manufacturing a semiconductor device having a field effect transistor, the field effect transistor including a gate dielectric layer, a source region and a drain region, wherein a semi-recessed LOCOS layer is provided between the gate dielectric layer and the drain region, and an offset impurity layer is provided below the semi-recessed LOCOS layer. The method includes forming a recessed section in a region where the semi-recessed LOCOS layer is to be formed, and implanting an impurity in a semiconductor substrate in the recessed section. The method also includes thermally oxidizing the semiconductor substrate to form the semi-recessed LOCOS layer in the recessed section.

Another embodiment relates to a semiconductor device including first and second field effect transistors that each include a gate dielectric layer and source and drain regions. The first and second field effect transistors also each include a semi-recessed LOCOS layer positioned between the gate dielectric layer and the drain region, and an offset impurity layer below the semi-recessed LOCOS layer. The semiconductor device also includes an element isolation region located between the first and second field effect transistors.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
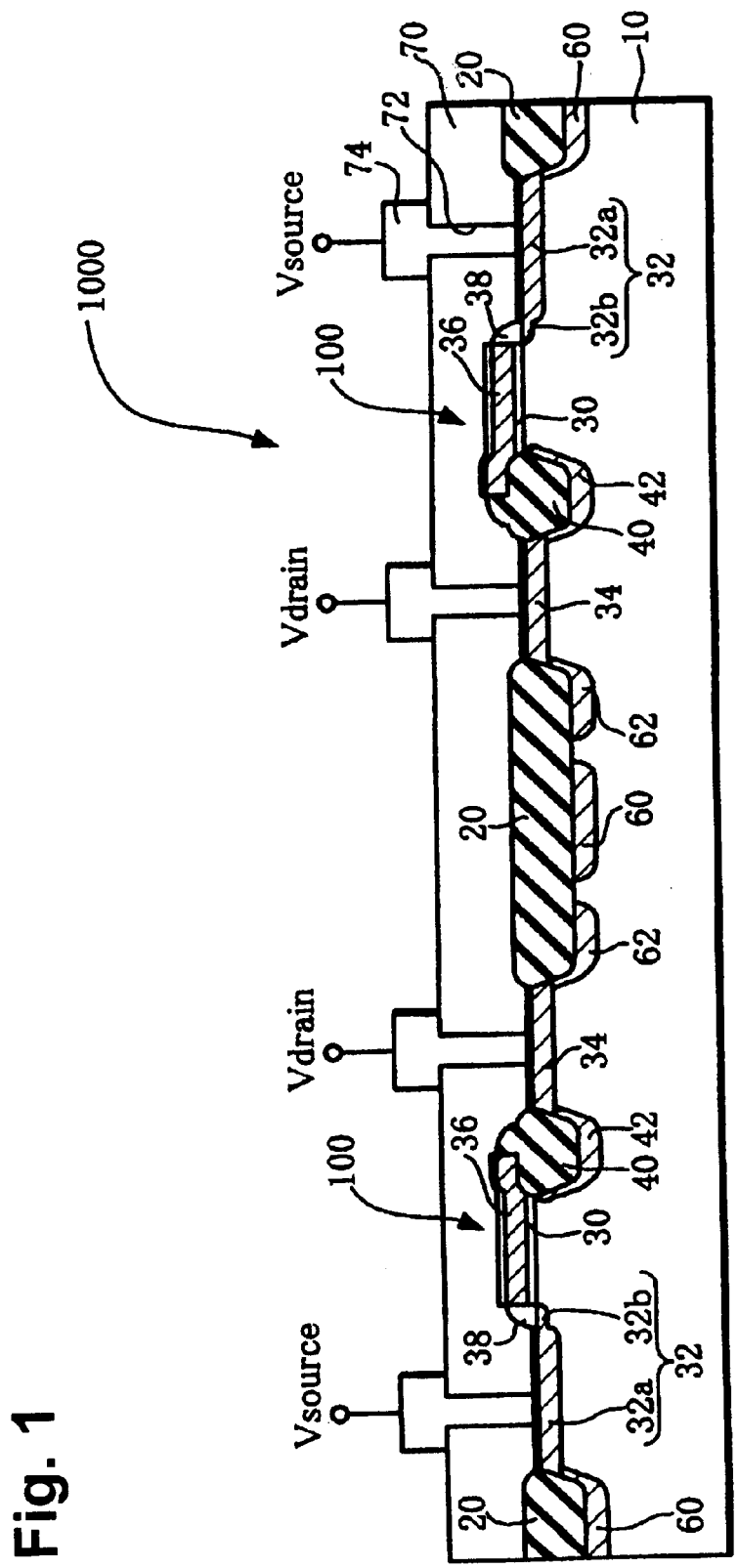
FIG. 1 schematically shows a semiconductor device in accordance with a first embodiment of the present invention.

Certain embodiments of the present invention relate to semiconductor devices having an improved dielectric strength and methods for manufacturing the same.

A semiconductor device in accordance with certain embodiments of the present invention may include a semiconductor device having a field effect transistor, the field effect transistor including a gate dielectric layer, a source region and a drain region, wherein a semi-recessed LOCOS layer is provided between the gate dielectric layer and the drain region, and an offset impurity layer is provided below the semi-recessed LOCOS layer.

In accordance with certain embodiments, for example, the following effects may be attained. The field effect transistor has a semi-recessed LOCOS layer. Further, an offset impurity layer is provided below the semi-recessed LOCOS layer. Accordingly, the offset impurity layer can be made relatively deep with respect to the channel region compared to the case where a semi-recessed LOCOS layer is not formed. As a result, when the field effect transistor is an ON state, a deep depletion layer can be formed by the offset impurity layer. Consequently, the electric field adjacent to the drain electrode is alleviated, to thereby increase the drain dielectric strength, and therefore a higher dielectric strength is achieved.

Also, in accordance with certain embodiments, the width of a bird's beak can be narrowed compared to the LOCOS layer. As a result, a miniaturization can be achieved compared to the LOCOS.

Also, in accordance with certain embodiments, since the semi-recessed LOCOS layer is not formed between the gate dielectric layer and the source region, the field effect transistor can be miniaturized.

Also, the semiconductor device may preferably be used as a semiconductor device having a drain dielectric strength of 10–50V. Also, in particular, the semiconductor device may preferably be used as a liquid crystal display (LCD) driver.

The semi-recessed LOCOS layer may have a thickness of 0.3–0.7 µm, for example.

The semiconductor device may preferably have an element isolation region, and the element isolation region may preferably have a semi-recessed LOCOS structure. When the element isolation region has a semi-recessed LOCOS structure, the element isolation region may be formed in the same process in which the semi-recessed LOCOS layer is formed. A channel stopper layer may be provided below the element isolation region.

A low concentration impurity layer having a conductivity type identical with a conductivity type of the drain region may preferably be provided around the drain region. By providing the low concentration impurity layer, when the field effect transistor is an ON state, the region of the low concentration impurity layer becomes a depletion layer to thereby increase the drain dielectric strength.

A semiconductor device in accordance with certain embodiments of the present invention can be manufactured, for example, in the following manner.

A method for manufacturing a semiconductor device in accordance with certain embodiments of the present invention relates to a method for manufacturing a semiconductor having a field effect transistor, the field effect transistor including a gate dielectric layer, a source region and a drain region, wherein a semi-recessed LOCOS layer is provided between the gate dielectric layer and the drain region, and an offset impurity layer is provided below the semi-recessed LOCOS layer. The method for manufacturing a semiconductor device in accordance with certain embodiments includes the steps of:

(a) forming a recessed section in a region where the semi-recessed LOCOS layer is to be formed;

(b) implanting an impurity in a semiconductor substrate in the recessed section; and (c) thermally oxidizing the semiconductor substrate to form the semi-recessed LOCOS layer in the recessed section.

The method may further include the step (d) of forming an anti-oxidation layer having a predetermined pattern, wherein the step (c) may preferably be conducted using the anti-oxidation layer formed on the semiconductor substrate as a mask.

As a result, in the above method embodiments, the semiconductor substrate in a predetermined region can be securely thermally oxidized. Also, in the step (b), when the impurity is implanted in the semiconductor substrate, the impurity is suppressed from being implanted in the semiconductor substrate that is covered by the anti-oxidation layer.

The anti-oxidation layer may preferably have a film thickness of 50–70 nm. When the film thickness of the anti-oxidation layer is 50 nm or greater, when the impurity is implanted in the semiconductor substrate in the step (b), the impurity is prevented or inhibited from being implanted in the semiconductor substrate that is covered by the anti-oxidation layer.

Prior to the step (b), the step (e) of forming a protection layer over the semiconductor substrate in the recessed section may preferably be included. It is noted that the protection film is a film that suppresses damage to the semiconductor substrate when the impurity is implanted in the semiconductor substrate. By the inclusion of the step (e), damage to the semiconductor substrate in the recessed section can be suppressed.

The protection-layer may, for example, be a silicon oxide layer. The silicon oxide layer may be formed by a thermal oxidation method. By the thermal oxidation method, the silicon oxide layer can be securely formed over an exposed surface of the semiconductor substrate in the recessed section.

Also, when the protection film is formed, the step (f) of removing the protection film may preferably be included after the step (b). By the inclusion of the step (f), the film quality of the semi-recessed LOCOS layer thus obtained can be improved.

In the step (a), the recessed section may preferably be formed with a tapered configuration. As a result, in the step (b), the impurity can be readily implanted on side surfaces of the silicon substrate in the recessed section.

The recessed section may preferably have a tapered angle of 60 degrees or greater but preferably less than 90 degrees. As a result, in the step (b), the impurity can be readily implanted on a side surface of the silicon substrate in the recessed section.

In the step (b), an implanting direction of the impurity may preferably traverse a normal line of a surface of the semiconductor substrate. As a result, in the step (b), the impurity can be readily implanted on a side surface of the silicon substrate in the recessed section.

The implanting direction of the impurity and the normal line of the surface of the semiconductor substrate may preferably define an angle that is greater than zero degrees but preferably 45 degrees or less. As a result, in the step (b), the impurity can be readily implanted on a side surface of the silicon substrate in the recessed section.

Certain preferred embodiments of the present invention are described below with reference to the accompanying figures.

A semiconductor device in accordance with a first embodiment of the present invention is described below. FIG. 1 schematically shows a cross-sectional view of a semiconductor device in accordance with the first embodiment of the present invention.

A semiconductor device 1000 includes element isolation regions 20. The element isolation regions 20 each have a semi-recessed LOCOS structure. A field effect transistor (herein below referred to as "transistor") 100 may be provided for each region defined by the element isolation regions 20.

The transistor 100 includes a gate dielectric layer 30, a source region 32, and a drain region 34. The source region 32 is formed from a high concentration impurity diffusion layer 32a, and a low concentration impurity diffusion layer 32b. The source region 32 and the drain region 34 are each formed from an N-type impurity diffusion layer formed in a P-type well in the case of an N-type transistor as an example; and are each formed from a P-type diffusion layer formed in an N-type well in the case of a P-type transistor as an example.

A semi-recessed LOCOS layer 40 is formed between the gate dielectric layer 30 and the drain region 34. The film thickness of the semi-recessed LOCOS layer 40 may vary depending on the device designs, and may be, for example, 0.3–0.7 µm, and more preferably, 0.4–0.6 µm. An offset impurity layer 42 is formed below the semi-recessed LOCOS layer 40. The offset impurity layer 42 is formed from an N-type impurity diffusion layer in the case of an N-type transistor as an example; and is formed from a P-type diffusion layer in the case of a P-type transistor as an example.

A channel stopper layer 60 may be formed in a central area of and below the element isolation region 20. The channel stopper layer 60 is formed from a P-type impurity diffusion layer in the case of an N-type transistor as an example; and is formed from an N-type diffusion layer in the case of a P-type transistor as an example.

Low concentration impurity layers 62 are formed below end sections of the element isolation region 20 adjacent to the drain region 34. By the low concentration impurity layers 62, when the transistor is an ON state, the region of the low concentration impurity layers 62 becomes depletion layers such that the drain dielectric strength can be increased. The low concentration impurity layers 62 are each formed from an N-type impurity diffusion layer in the case of an N-type transistor as an example; and formed from a P-type diffusion layer in the case of a P-type transistor as an example.

A contact region is formed in the semiconductor device 1000 to apply a voltage to the silicon substrate 10. The contact region is isolated from the source region or the drain region by the element isolation region. A channel stopper layer can be formed below the element isolation region depending on the requirements.

An interlayer dielectric layer 70 is formed over the silicon substrate 10. Contact holes 72 are formed in specified regions of the interlayer dielectric layer 70. Wiring layers 74 are formed in the contact holes 72 and over the interlayer dielectric layer 70.

The semiconductor device 1000 in accordance with the first embodiment of the present invention may have one or more of the effects described below.

(a) In the present embodiment, each of the transistors 100 has the semi-recessed LOCOS layer 40. Further, the offset impurity layer 42 is provided below the semi-recessed LOCOS layer 40. Therefore, the offset impurity layer 42 can be made relatively deep with respect to the channel region compared to the case where a semi-recessed LOCOS layer is not formed. As a result, when the transistor is an ON state, a deep depletion layer can be formed by the offset impurity layer 42. Consequently, the electric field adjacent to the drain electrode is alleviated, such that the drain dielectric strength is increased.

(b) Also, since the semi-recessed LOCOS layer is not formed between the gate dielectric layer 30 and the source region 32, the field effect transistor can be miniaturized.

(c) Also, the semiconductor device may preferably be used as a semiconductor device having a drain dielectric strength of 10–50 V. Also, in particular, the semiconductor device may preferably be used as an intermediate dielectric strength liquid crystal display (LCD) driver.

A method for manufacturing a semiconductor device in accordance with a second embodiment of the present invention is described below. More particularly, taking an N-type transistor as an example, a process for manufacturing a semiconductor device is described.

FIGS. 2–8 schematically show cross-sectional views in a manufacturing process in accordance with the second embodiment.

Figure 2:
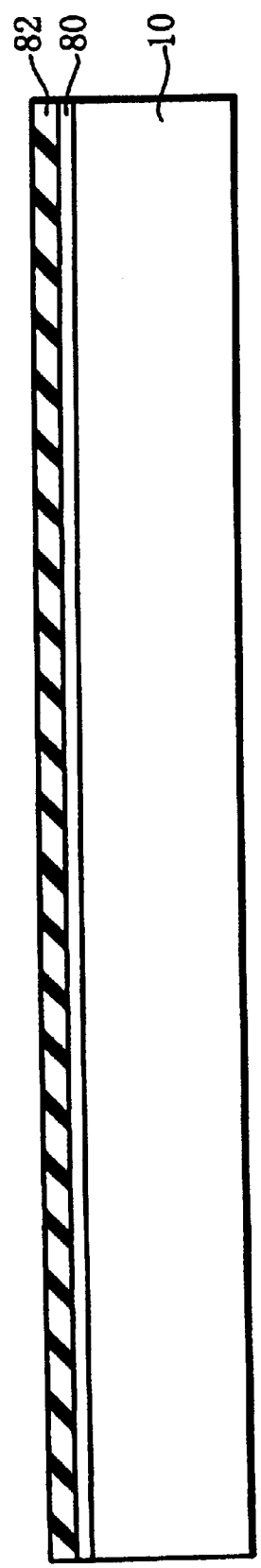
FIG. 2 schematically shows a cross-sectional view in a manufacturing process in accordance with a second embodiment.
Figure 3:
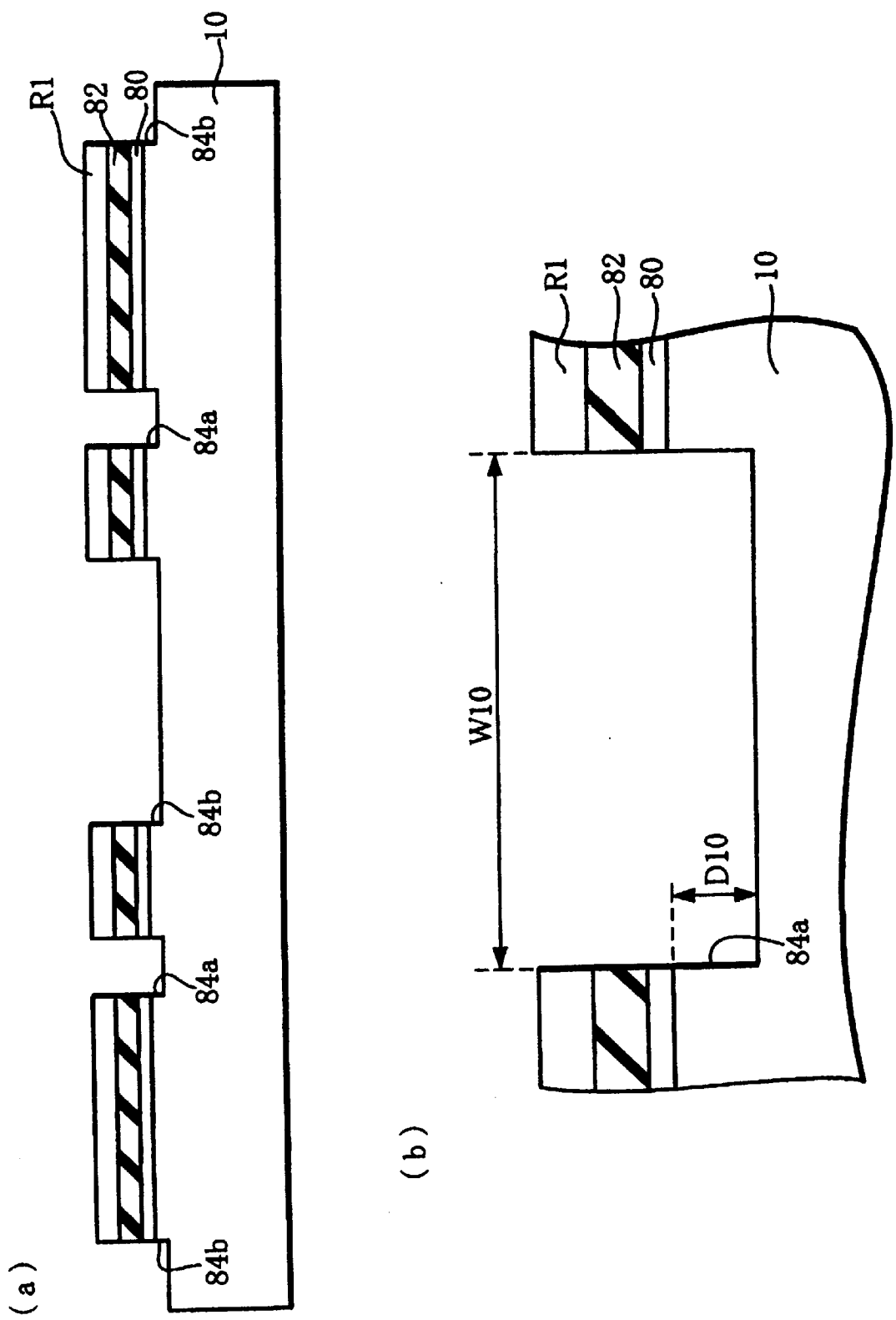
FIG. 3 schematically shows a cross-sectional view in the manufacturing process in accordance with the second embodiment.
Figure 4:
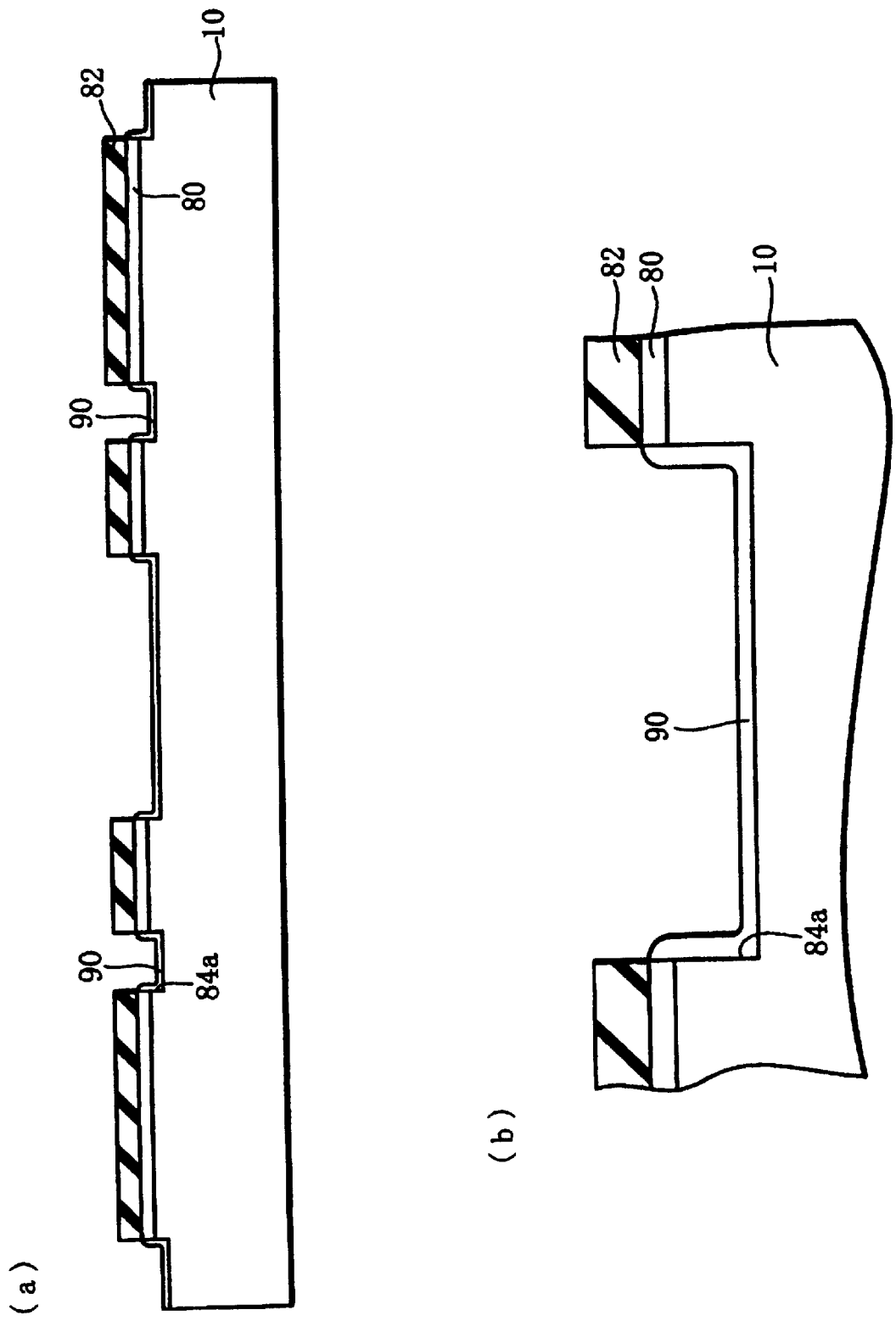
FIG. 4 schematically shows a cross-sectional view in the manufacturing process in accordance with the second embodiment.
Figure 5:
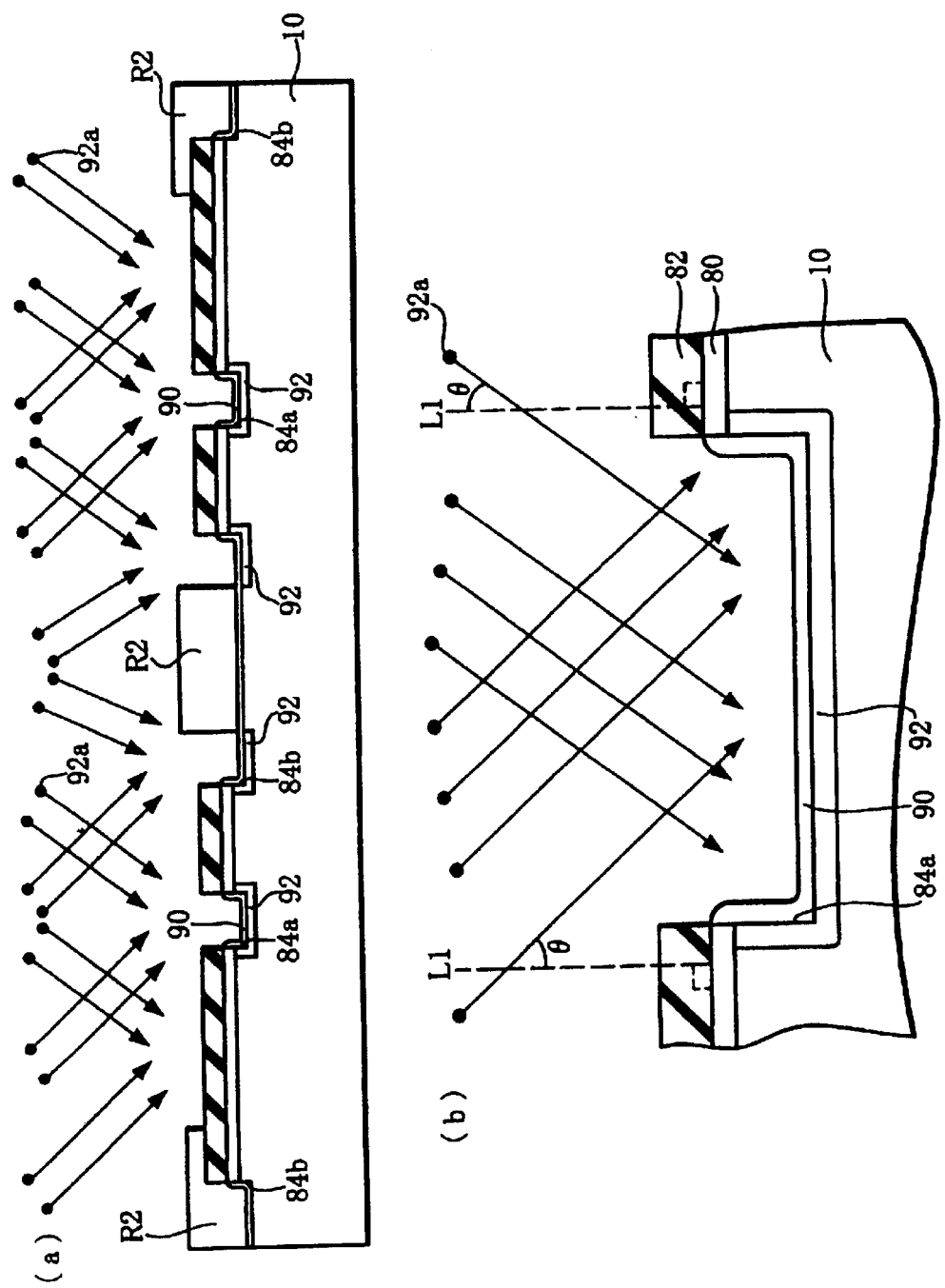
FIG. 5 schematically shows a cross-sectional view in the manufacturing process in accordance with the second embodiment.

(1) First, as shown in FIG. 2, a silicon oxide nitride layer 80 is formed over a silicon substrate 10 by a CVD method. The silicon oxide nitride layer 80 has a film thickness of, for example, 8 to 12 nm. Then, a silicon nitride layer 82 is formed over the silicon oxide nitride layer 80 by a CVD method. The silicon nitride layer 82 may have any film thickness to the extent that it can prevent ions from being implanted in the silicon substrate 10 that is covered by the silicon nitride layer 82 in an ion implementation step to be described below. The film thickness of the silicon nitride layer 82 may preferably be 50–70 nm, and more preferably 60–65 nm.

(2) Then, as shown in FIG. 3(a), a first resist layer R1 having a predetermined pattern is formed over the silicon nitride layer 82. The first resist layer R1 has openings above regions where element isolation regions 20 and semi-recessed LOCOS layers 40 are to be formed.

Then, the silicon nitride layer 82, the silicon oxide nitride layer 80 and the silicon substrate 10 are etched using the first resist layer R1 as a mask. As a result, first and second recessed (or trench or concave) sections 84a and 84b are formed in regions where the element isolation regions 20 and the semi-recessed LOCOS layers 40 are to be formed. Recessed section refers to an opening including, but not limited to, a concave opening or trench. The first recessed section 84a is formed in a region that becomes the semi-recessed LOCOS layer 40, and the second recessed section 84b is formed in a region that becomes the element isolation region 20. It is noted that FIG. 3(b) schematically shows an enlarged cross-sectional view of the first recessed section 84a of FIG. 3(a). The width W10 of the first recessed section 84a may differ depending on the dielectric strength and characteristics of the device, and may be, for example, 0.3–5.0 $\mu$m, and more preferably, 0.5–2.0 $\mu$m. The depth D10 of the first recessed section 84a may differ depending on the dielectric strength and characteristics of the device, and may be, for example, 0.05–0.15 $\mu$m, and more preferably, 0.08–0.1 $\mu$m. The width and the depth of the second recessed section 84b may be the same as those of the first recessed section 84a. Then, the first resist layer R1 is removed.

(3) Then, as shown in FIG. 4(a), a silicon oxide layer 90 is formed over an exposed surface of the silicon substrate 10 by a thermal oxidation method. It is noted that FIG. 4(b) schematically shows an enlarged cross-sectional view of the first recessed section 84a of FIG. 4(a). It is noted that the silicon oxide layer 90 can be formed by a CVD method. The film thickness of the silicon oxide layer 90 may be, for example, 5.0–10 nm, and more preferably, 6.0–7.0 nm.

(4) Then, as shown in FIG. 5(a), a second resist layer R2 having a predetermined pattern is formed. The second resist layer R2 has openings provided above the first recessed sections 84a and end sections of the second recessed sections 84b. More concretely, the openings are provided above regions where the semi-recessed LOCOS layers 40 and the low concentration impurity layers 62 are to be formed.

Then, N-type ions 92a are implanted in the silicon substrate 10 using the second resist layer R2 as a mask. As a result, N-type impurity diffusion layers 92 are formed in the first and second recessed sections 84a and 84b. In succeeding steps, the N-type impurity diffusion layers 92 in the first recessed sections 84a become offset impurity layers 42. Also, the N-type impurity diffusion layers 92 in the second recessed sections 84b become low concentration impurity layers 62.

It is noted that FIG. 5(b) schematically shows an enlarged cross-sectional view of the first recessed section 84a of FIG. 5(a). Because the silicon oxide layer 90 is formed, damages by the ion implantation to the silicon substrate 10 in the first and second recessed sections 84a and 84b are suppressed. As a result, crystal lattices of the silicon substrate 10 are severed such that the formation of electrical current paths is suppressed. The N-type ions 92a may be, for example, phosphorous ions. The ion acceleration voltage may vary depending on the dielectric strength and characteristics of the device, and may be, for example, 10–50 keV, and more preferably 20–25 keV. The dose may vary depending on the dielectric strength and characteristics of the device, and may be, for example, $1.0E+13$ to $1.5E+14$ cm$^{-2}$, and more preferably, 3.0E+13 to 5.0E+13 cm$^{-2}$. The ion implantation angle (an angle defined between a normal line L1 of the surface of the semiconductor substrate and a direction in which the ions are implanted) θ is not particularly limited, and may be, for example, 0–45 degrees, and more preferably, greater than zero (0) degrees but 45 degrees or less, and even more preferably, between 5 degrees and 20 degrees. When the ion implantation angle θ is greater than zero (0) degrees but 45 degrees or smaller, the ions can be securely implanted in the side surfaces of the silicon substrate 10 in the recessed sections 84a and 84b. Then, the second resist layer R2 is removed.

Figure 6:
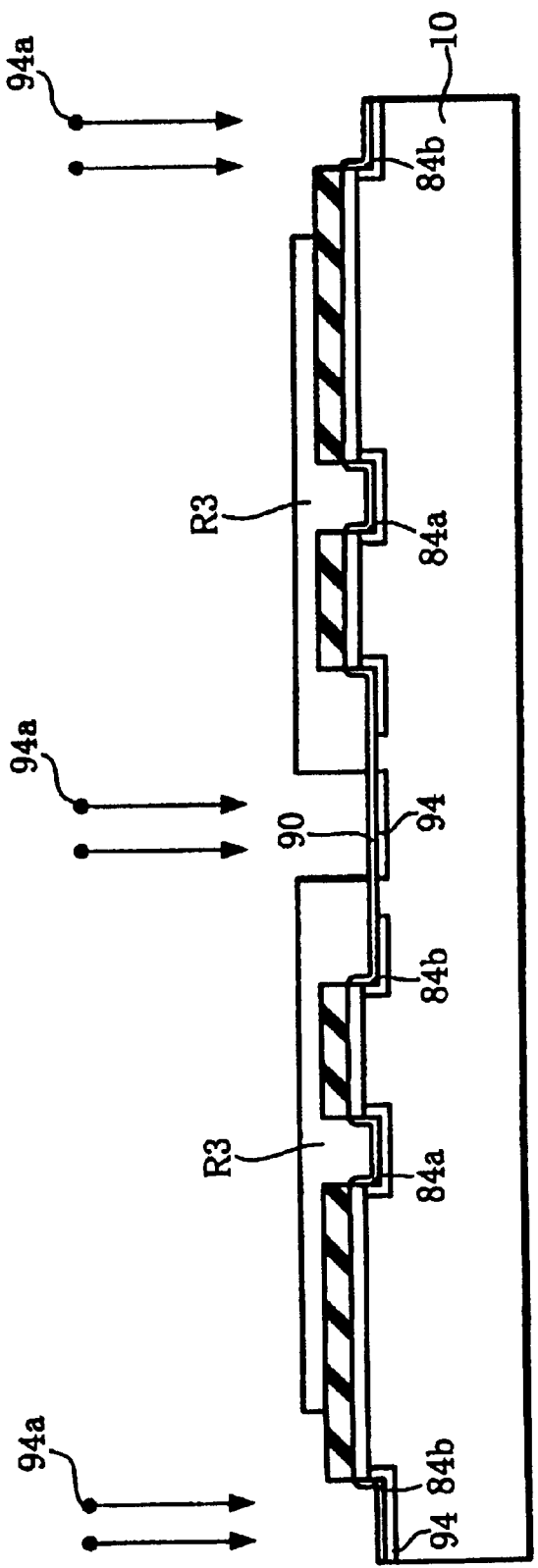
FIG. 6 schematically shows a cross-sectional view in the manufacturing process in accordance with the second embodiment.
Figure 7:
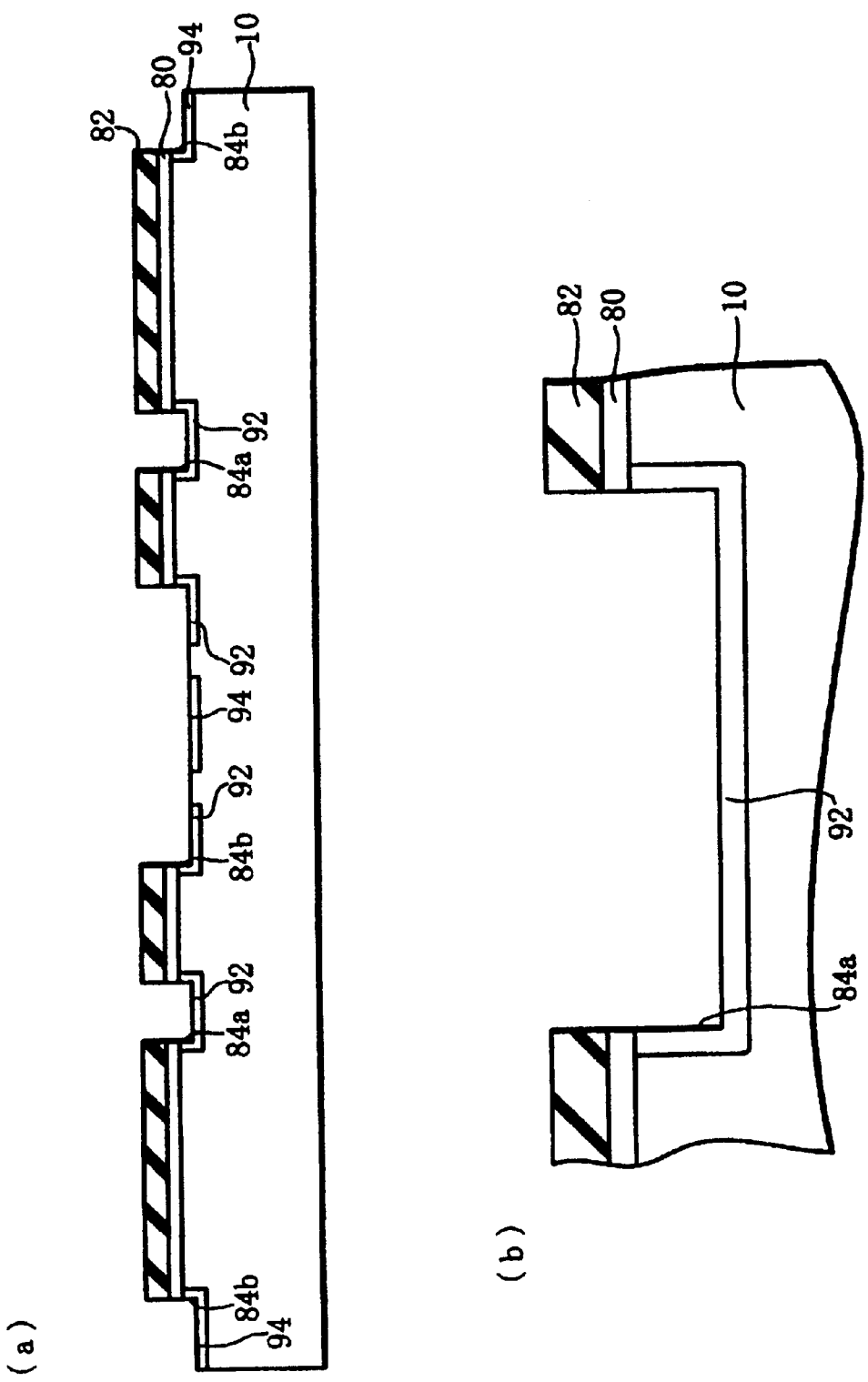
FIG. 7 schematically shows a cross-sectional view in the manufacturing process in accordance with the second embodiment.

(5) Then, as shown in FIG. 6, a third resist layer R3 having a predetermined pattern is formed. The third resist layer R3 has an opening provided in a central section of the second recessed section 84b. More concretely, the third resist layer R3 has the opening provided above a region where the channel stopper layer 60 is to be formed.

Then, P-type ions 94a are implanted in the silicon substrate 10 using the third resist layer R3 as a mask. As a result, P-type impurity diffusion layers 94 are formed in the second recessed sections 84b. In succeeding steps, the P-type impurity diffusion layers 94 become channel stopper layers 60. The P-type ions 94a may be, for example, boron ions. The ion acceleration voltage may vary depending on the dielectric strength and characteristics of the device, and may be, for example, 5–10 keV, and more preferably 7–8 keV. The dose may vary depending on the dielectric strength and characteristics of the device, and may be, for example, 1.0E+13 to 1.5E+14 cm$^{-2}$, and more preferably, 3.0E+13 to 1.0E+14 cm$^{-2}$. Then, the third resist layer R3 is removed.

(6) Then, as shown in FIG. 7(a), the silicon oxide layer 90 is removed. It is noted that FIG. 7(b) schematically shows an enlarged cross-sectional view of the first recessed section 84a of FIG. 7(a). It is noted that the silicon oxide layer 90 may not have to be removed if it does not adversely affect the characteristics of the device.

Figure 8:
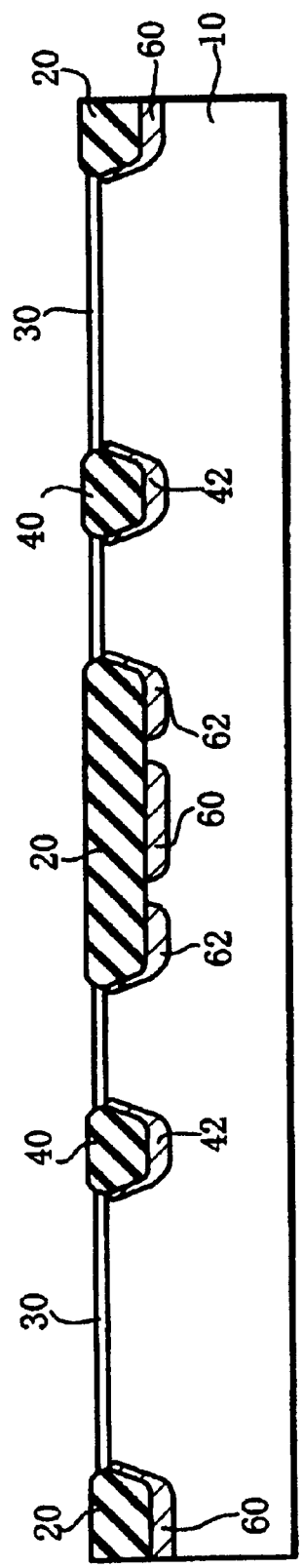
FIG. 8 schematically shows a cross-sectional view in the manufacturing process in accordance with the second embodiment.

Then, the silicon substrate 10 is thermally oxidized using the silicon nitride layer 82 as an anti-oxidation layer. As a result, as shown in FIG. 8, the element isolation regions 20 and the semi-recessed LOCOS layers 40 are formed. In this thermal oxidation step, the ions implanted in the silicon substrate 10 in the first recessed sections 84a are defused (driven in), such that offset impurity layers 42 are formed. Also, at the same time, the ions implanted in the silicon substrate 10 in the second recessed sections 84b are defused (driven in), such that channel stopper layers 60 and low concentration impurity layers 62 are formed.

Then, the silicon nitride layer 82 and silicon oxide nitride layer 80 are removed. Then, the surface of the silicon substrate 10 is thermally oxidized to form gate dielectric layers 30.

(7) Next, as shown in FIG. 1, a conductive polysilicon layer is deposited over the wafer including the LOCOS layers 20. Then, by photolithography and etching, gate electrodes 36 are formed over the gate dielectric layers 30.

(8) Then, N-type ions such as phosphorus are implanted in the silicon substrate 10 using the gate electrodes 36 as a mask. As a result, low concentration impurity layers 32b that form source regions 32 are formed. Then, sidewalls 38 are formed on sides of the gate electrodes 36. N-type ions such as phosphorus ions are implanted in the silicon substrate 10 using the gate electrodes 36, the sidewalls 38, and semi-recessed LOCOS layers 40 as a mask. As a result, high concentration impurity layers 32a that form the source regions 32, and the drain regions 34 are formed.

Then, an interlayer dielectric layer 70 is deposited over the wafer including the gate electrodes 36. By conducting photolithography and etching, contact holes 72 are formed in the interlayer dielectric layer 70.

Then, a conduction layer formed from, for example, an aluminum alloy, copper, or the like is deposited in the contact holes 72 and over the interlayer dielectric layer 70; and the conduction layer is patterned to form wiring layers 74.

The method for manufacturing the semiconductor device in accordance with the second embodiment of the present invention may have one or more of the effects described below.

(a) In accordance with the present embodiment, when implanting ions in the recessed sections 84a and 84b, the silicon oxide layer 90 is formed over the surface of the silicon substrate 10 in the recessed sections 83a and 84b. As a result, damage by the ion implantation to the silicon substrate 10 in the first and second recessed sections 84a and 84b are suppressed. As a result, crystal lattices of the silicon substrate 10 are severed such that the formation of electrical current paths is suppressed.

(b) In the step of implanting ions in the silicon substrate 10 in the first recessed sections 84a, when the ion implantation angle θ is greater than zero (0) degrees but 45 degrees or less, the following effects may be achieved. Namely, when the ion implantation angle θ is greater than zero (0) degrees but 45 degrees or less, the ions can be securely implanted on sides of the silicon substrate 10 in the first recessed sections 84a. As a result, the offset impurity layers 42 can be securely formed on the sides of the semi-recessed LOCOS layers 40.

It is noted that, P-type transistors may be manufactured in parallel with the manufacturing of the N-type transistors. For example, P-type transistors can be manufactured in parallel with the manufacturing of the N-type transistors in the following manner.

(A) Recessed sections in regions where offset impurity layers of the P-type transistors are to be formed may be formed at the same time when the above-described recessed sections are formed in the forming step (2). (B) The step of implanting P-type ions to form the offset impurity layers of the P-type transistors may be conducted at the same time when the step (5) to form the above-described channel stopper layers is conducted.

Figure 9:
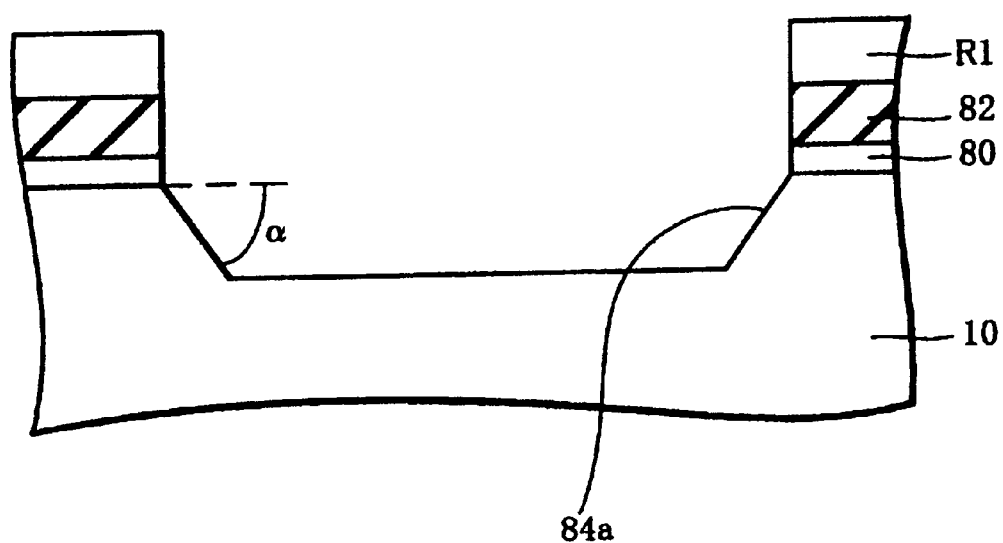
FIG. 9 schematically shows an enlarged cross-sectional view of a recess section to describe a main portion in a method for manufacturing a semiconductor device in accordance with a third embodiment of the present invention.

Next, a method for manufacturing a semiconductor device in accordance with a third embodiment of the present invention is described below. FIG. 9 schematically shows an enlarged cross-sectional view of a recessed section to describe a main portion in the method for manufacturing a semiconductor device in accordance with the third embodiment of the present invention.

The third embodiment is different from the second embodiment in the method of forming recessed sections. The third embodiment is the same as the second embodiment except the method of forming recessed sections, and therefore a detailed description thereof is omitted.

In the third embodiment, as shown in FIG. 9, the silicon substrate 10 is etched in a manner that the first recessed section 84a has a tapered configuration. The taper angle α of the first recessed section 84a is less than 90 degree, more preferably, 60 degrees or greater but less than 90 degrees, and even more preferably between 70 and 80 degrees. An etching method for forming the recessed sections may not particularly be limited as long as the method can provide the first recessed section 84a with tapered shapes. More concretely, the silicon substrate 10 may be etched by an etching apparatus having parallel plate electrodes in the following manner as an example. First, the silicon substrate 10 is disposed over the parallel plate lower electrode. Power of, for example, 200 W may be applied between the electrodes to etch the silicon substrate 10. As a concrete condition, the etching is conducted under a vacuum having a pressure of, for example 700 mTorr. An etching gas to be used in the etching may be a gas including, for example, $CHF_3$, $CF_4$, Ar, $O_2$, and the quantity ratio of these gases may be, for example, 10/70/800/4 sccm (=$CHF_3$/$CF_4$/Ar/$O_2$).

The method for manufacturing the semiconductor device in accordance with the third embodiment of the present invention may include one or more of the effects described below.

(a) The third embodiment provides similar effects as the effect (a) of the second embodiment.

(b) In the third embodiment, the first recessed sections 84a are formed to have taper configurations (the taper angle α is less than 90 degrees). As a result, in a step of implanting ions in the silicon substrate 10 in the first recessed sections 84a, the ions can be securely implanted in the sides of the second substrate 10. As a result, the offset impurity layers 42 can be securely formed on the sides of the semi-recessed LOCOS layers 40.

The present invention is not limited to the embodiments described above, and a variety of other embodiments can be made within the scope of the subject matter of the invention.

What is claimed:

1. A semiconductor device comprising a field effect transistor, the field effect transistor including a gate dielectric layer, a source region and a drain region, wherein a semi-recessed LOCOS layer is provided between the gate dielectric layer and the drain region, wherein the device is free of a semi-recessed LOCOS layer between the gate dielectric layer and the source region, and an offset impurity layer is provided below the semi-recessed LOCOS layer.

2. A semiconductor device according to claim 1, wherein the semi-recessed LOCOS layer has a thickness of 0.3–0.7 μm.

3. A semiconductor device according to claim 1, further comprising an element isolation region, wherein the element isolation region has a semi-recessed LOCOS structure.

4. A semiconductor device according to claim 3, wherein a channel stopper layer is provided below the element isolation region.

5. A semiconductor device according to claim 1, wherein a low concentration impurity layer having a conductivity type identical with conductivity type of the drain region is provided adjacent to the drain region.

6. A method for manufacturing a semiconductor device having a field effect transistor, the field effect transistor including a gate dielectric layer, a source region and a drain region, wherein a semi-recessed LOCOS layer is provided between the gate dielectric layer and the drain region, and an offset impurity layer is provided below the semi-recessed LOCOS layer, the method comprising:

forming a recessed section in a semiconductor substrate where the semi-recessed LOCOS layer is to be formed between the gate dielectric layer and the drain region;

implanting an impurity in the semiconductor substrate in the recessed section; and then thermally oxidizing the semiconductor substrate to form the semi-recessed LOCOS layer in the recessed section.

7. A method for manufacturing a semiconductor device according to claim 6, further comprising forming an anti-oxidation layer having a predetermined pattern, wherein the thermally oxidizing the semiconductor substrate to form the semi-recessed LOCOS layer in the recessed section is conducted using the anti-oxidation layer as a mask.

8. A method for manufacturing a semiconductor device according to claim 7, wherein the anti-oxidation layer has a film thickness of 50–70 nm.

9. A method for manufacturing a semiconductor device according to claim 7, further comprising, before the forming of the anti-oxidation layer, forming a protection film over the semiconductor substrate in the recessed section.

10. A method for manufacturing a semiconductor device according to claim 9, wherein the protection film is a silicon oxide layer.

11. A method for manufacturing a semiconductor device according to claim 10, wherein the silicon oxide layer is formed by a thermal oxidation method.

12. A method for manufacturing a semiconductor device according to claim 9, further comprising, after the implanting an impurity in the semiconductor substrate in the recessed section, removing the protection film.

13. A method for manufacturing a semiconductor device according to claim 6, wherein the recessed section is formed with a tapered configuration.

14. A method for manufacturing a semiconductor device according to claim 13, wherein the recessed section has a tapered angle of 60 degrees or greater and less than 90 degrees.

15. A method for manufacturing a semiconductor device according to claim 6, wherein an implanting direction of the impurity traverses a normal line of a surface of the semiconductor substrate during the implanting an impurity in the semiconductor substrate in the recessed section.

16. A method for manufacturing a semiconductor device according to claim 15, wherein the implanting direction of the impurity and the normal line of the surface of the semiconductor substrate define an angle that is greater than zero degrees and no greater than 45 degrees.

17. A semiconductor device comprising:

first and second field effect transistors each including a gate dielectric layer; source and drain regions; a semi-recessed LOCOS layer positioned between the gate dielectric layer and the drain region; and an offset impurity layer below the semi-recessed LOCOS layer; and an element isolation region located between the first and second field effect transistors;

wherein no semi-recessed LOCOS layer is located between the gate dielectric layer and the source region.

18. A semiconductor device according to claim 17, wherein said element isolation region includes a semi-recessed LOCOS structure.

19. A semiconductor device according to claim 17, further comprising a channel stopper layer formed below the element isolation region.

20. A method for manufacturing a semiconductor device according to claim 13, wherein the recessed section has a tapered angle in the range of 70 degrees to 80 degrees.

21. A semiconductor device as in claim 17, further comprising a channel stopper layer below a central portion of the element isolation region, and low concentration impurity layers below end portions of the element isolation region, wherein the element isolation region is spaced apart from the low concentration impurity layers.

* * * * *